United States Patent [19]

Taylor

[11] 4,267,153
[45] May 12, 1981

[54] GRAVITY DAMPENED GUIDANCE SYSTEM

[75] Inventor: Aaron S. Taylor, Acton, Mass.

[73] Assignee: Mobil Tyco Solar Energy Corporation, Waltham, Mass.

[21] Appl. No.: 65,281

[22] Filed: Aug. 9, 1979

[51] Int. Cl.³ .................. C30B 35/00; C30B 15/34
[52] U.S. Cl. ................... 422/249; 422/246; 156/608; 156/617 SP; 156/DIG. 88
[58] Field of Search ............ 156/DIG. 64, DIG. 88, 156/DIG. 98, 601, 608, 617 SP; 422/246, 249; 65/199–201, 92; 226/186, 195

[56] References Cited

U.S. PATENT DOCUMENTS

| | | | |
|---|---|---|---|
| 1,719,946 | 7/1929 | Sherman | 226/195 |
| 3,206,286 | 9/1965 | Bennett, Jr. et al. | 156/608 |
| 3,226,203 | 12/1965 | Rummel | 422/249 |
| 3,607,112 | 9/1971 | Mermelstein | 422/249 |
| 4,158,038 | 6/1979 | Jewett | 422/249 |

Primary Examiner—Frank W. Lutter
Assistant Examiner—Gregory N. Clements
Attorney, Agent, or Firm—Schiller & Pandiscio

[57] ABSTRACT

A crystal growth guidance mechanism for use in crystal growing apparatus. The guidance mechanism, which is disposed between a crystal puller and a crystal forming die comprises a plurality of gravity damped guide rods mounted on ramped supports. The rods have sufficient mass and number so that when acting in unison the rods will provide sufficient resistance to prevent puller induced motion in the crystal from being translated down into the die top, while individual guide rods "float" on the surface of the growing crystal whereby each rod will move out of the way of any localized surface perturbations in the growing crystal.

16 Claims, 5 Drawing Figures

GRAVITY DAMPENED GUIDANCE SYSTEM

This invention relates generally to the growth of elongate cystals from the melt and more particularly to an improved crystal growth guidance mechanism for use in combination with a crystal growing furnace.

A number of processes are known for growing crystalline bodies from the melt. Two prior art processes which are known to persons skilled in the art are described by U.S. Pat. Nos. 3,591,348 and 3,471,266. According to U.S. Pat. No. 3,591,348 crystalline bodies are grown according to what is commonly called the edge-defined, film-fed growth technique (commonly referred to as the EFG process). In the EFG process the shape of the crystalline body which is grown is determined by the external or edge configuration of the end surface of a forming member, which, for want of a better name is called a die. The process involves growth on a seed from melt which is located between the growing body and the end surface of the die, with the melt being continuously replenished from a suitable melt reservoir via one or more capillaries in the die. The growing body grows to the shape of the edge configuration of the top end of the die.

U.S. Pat. No. 3,471,266 discloses a related process which employs a forming member that includes a capillary for containing a supply of melt from which a crystal body is grown and pulled. By appropriately controlling the thermal conditions in the upper end of the capillary, it is possible to grow crystal bodies of selected cross-sectional shapes. Both of the foregoing processes are useful in growing material such as alumina and silicon in various shapes, including cylindrical tubes and thin flat ribbons.

The growth of crystals by both of the above described processes typically involves the use of apparatus which comprises a furnace adapted to accommodate a crucible containing a source of material maintained as a melt, a capillary die with one end disposed in the melt, and pulling means for contacting the surface of the melt with a seed crystal and for slowly withdrawing the seed at a rate and under conditions such that a portion of the melt solidifies on the seed. By appropriately maintaining process conditions, a crystal of considerable length can be pulled from the melt.

The growth of crystals by both of the above described methods usually involves the use of die holders, heat shields, after heaters, and pullers in addition to the dies. Also, when growing ribbons, guides are usually provided to prevent twist in the growing ribbon. Guides may also prevent any motion induced by gas turbulence along the length of the growing ribbon within the furnace from being felt at the die top, and may prevent ribbon swing or wiggling, which may occur when a growing ribbon having thickness variations and/or ripples enters the belt puller, from being felt at the die top, thereby causing the ribbon to grow crooked, or in the extreme case, break free of the melt. Guides also may assist in locating the seed at the die top when introducing a long seed through the top of the furnace.

Prior to the present invention the art generally employed fixed position guide rods or rigid guide rails. Fixed position guide rods or guide rails work, but only to a limited extent. Generally, the passageway between the guide rods or guide rails is made excessively wide in order to permit free passage of ribbon irregularities such as included surface particles, ribbon thickness variations, seed junctions, and minor ripples which may be introduced by the belt puller. Even then, self-perpetuating oscillations may occur as ribbon irregularities may bounce off the guide rods or guide rails to cause additional perturbations.

Accordingly, it is a primary object of the present invention to provide a new and improved crystal growing guidance apparatus which overcomes the foregoing and other problems of the prior art.

A more specific object is to provide a crystal growing guidance apparatus of the foregoing type for preventing twist, wiggle and/or ripple which may occur when a growing ribbon enters a belt puller from being felt at the die top.

The foregoing and other objects hereinafter described or rendered obvious are achieved by a crystal growing guidance mechanism which essentially comprises a plurality of gravity damped guide rods. The guide rods are mounted on ramped supports, and are movable up-and-down the supports. The supports are arranged in four vertical columns disposed so that two spaced vertically extending runs are formed, each run being defined by a pair of columns with the ramped supports of each pair of columns being oppositely inclined from the vertical run and spaced from one another so that the lower ends of the ramped supports in confronting vertical columns are spaced from one another slightly less than the thickness of the crystal to be grown. Accordingly, the guide rods, when permitted to lie at the lower-most positions on their respective supports, form a vertically extending passageway of width slightly less than the thickness of the crystal to be grown. The rods have a mass, number and freedom of movement such that when acting in unison, the combined "weight" or force applied by all the guide rods is sufficient to prevent puller induced motion from being felt at the die top, while the "weight" or force applied by one or a few of the guide rods is sufficiently low such that individual guide rods will move out of the way of any localized bulge, twist, ripple, surface particle or other like perturbation in the growing crystal.

Other features and many of the attendant advantages of the invention are presented in the following detailed description which is to be considered together with the accompanying drawings, in which.

Although the illustrated embodiment of the crystal growing guidance mechanism hereinafter described is described in connection with the growth of flat crystalline ribbons of silicon, it is to be understood that the guidance mechanism may be advantageously employed in the growth of flat crystalline ribbons of other materials. By way of example, but not limitation, the guidance mechanism of the present invention may be employed in the growth of ribbons of alumina. Further, it is contemplated that the guidance mechanism may be employed in combination with crystal growing furnaces which employ R.F. heating or electrical resistance heaters. Details of the furnace and ribbon pulling apparatus have been omitted from the following detailed description of the invention since various forms of furnaces and ribbon pullers are well known in the art and may be used in practicing this invention. Preferably, however, the furance is an R.F. heating unit and the pullers are of the type employing a pair of mutually confronting endless belts to grip and transport the growing crystal and are constructed in accordance with the teachings of U.S. Pat. No. 3,607,112 issued Sept. 21, 1971 to Seymour Mermelstein for Endless Belt Seed Crystal Gripping and Pulling Means. To the extent required, details of the furnace and the pullers described in said U.S. Pat. No. 3,607,112 are incorporated herein by reference.

Figure 1:
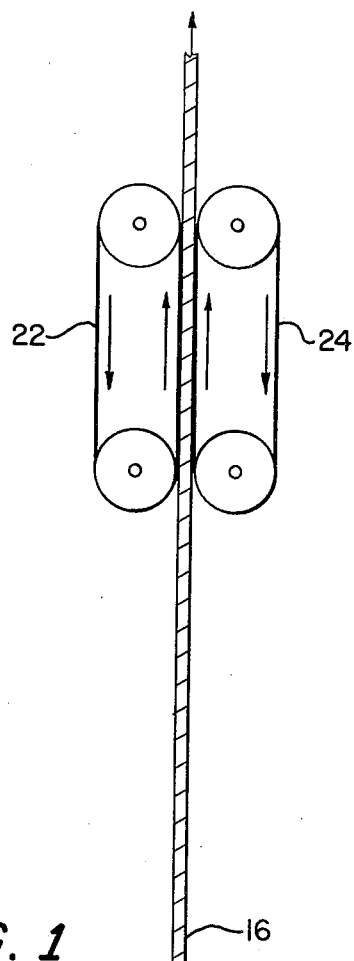
FIG. 1 is a side elevational view, in section, of a preferred form of crystal growing guidance mechanism in accordance with the present invention, assembled with a belt puller, crucilbe and die.

Referring to the drawings, FIG. 1 illustrates the crystal growing guidance mechanism of the present invention assembled in a system for continuously growing silicon ribbon. In FIG. 1 there is shown a crucible 2 which contains a supply of silicon 4. Crucible 2 is disposed in a furance enclosure (not shown) which contains heating means represented schematically at 6 and 8 which are used to maintain the supply of silicon in a molten state. Associated with and extending into the crucible is a graphite capillary die 10 which is shaped for growing flat crystals. The lower end of capillary die 10 is submerged into the silicon melt 4. Although not shown in detail, it is to be understood that at its upper end the breath of the die (i.e. dimension of die 10 which is perpendicular to the plane of the drawing of FIG. 1) is substantially greater than its width, i.e. the left-to-right dimension of the die in FIG. 1, so that the edge configuration of the die upper end is rectangular as required for growing a thin ribbon. Preferably the upper end of the die is bevelled on its opposite broad sides as shown at 12. The upper end of the die is surrounded by one or more radiation shields as shown at 14 which serve to limit radiative heat loss from the upper end of the die and the melt surface. In the normal operation, a ribbon 16 is continuously grown from the upper end of the die and the melt consumed in formation of the crystal ribbon is replaced by upper flow of melt in the capillary 18 of die 10.

Disposed above and spaced from radiation shield 14 is a crystal growing guidance mechanism made in accordance with the present invention and indicated generally at 20. Disposed above and spaced from crystal growing guidance mechanism 20 is a crystal pulling mechanism of the type taught by Mermelstein, supra, and comprising a pair of opposed endless belts 22 and 24. As seen in FIG. 1, belts 22 and 24 each have a vertically extending run, and the two belts are positioned adjacent one another so as to grip the opposite broad sides of the growing crystal 16 between the vertical runs. According to Mermelstein an advantage of such belt puller crystal pulling mechanism is that it can be adapted to pull a ribbon or other form of substantially monocrystalline body at a precisely controlled speed. This makes opposed belt pulling mechanisms preferred apparatus for pulling crystalline ribbons from the melt. However, as mentioned supra, a problem that arises in growing elongate flexible crystalline ribbons using opposed endless belt puller crystal pulling mechanisms spaced relatively long distances from a guidance system is that when ribbon irregularities such as included surface particles, ribbon thickness variations, seed junctions, and minor ripples enter between the opposed belts, this may result in crystal swing or ripple which may be translated down the growing crystal and felt at the die top. The crystal growing guidance mechanism 20 incorporating the principles of the present invention is designed to maintain the ribbon in position at the die top while permitting passage of ribbon irregularities such as surface particles, ribbon thickness variations, seed junctions and minor ripples.

Figure 3:
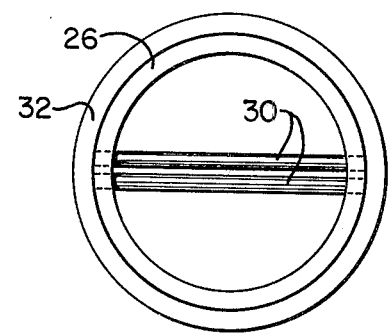
FIG. 3 is a top plan view of the crystal growing guidance mechanism of FIG. 2.
Figure 4:
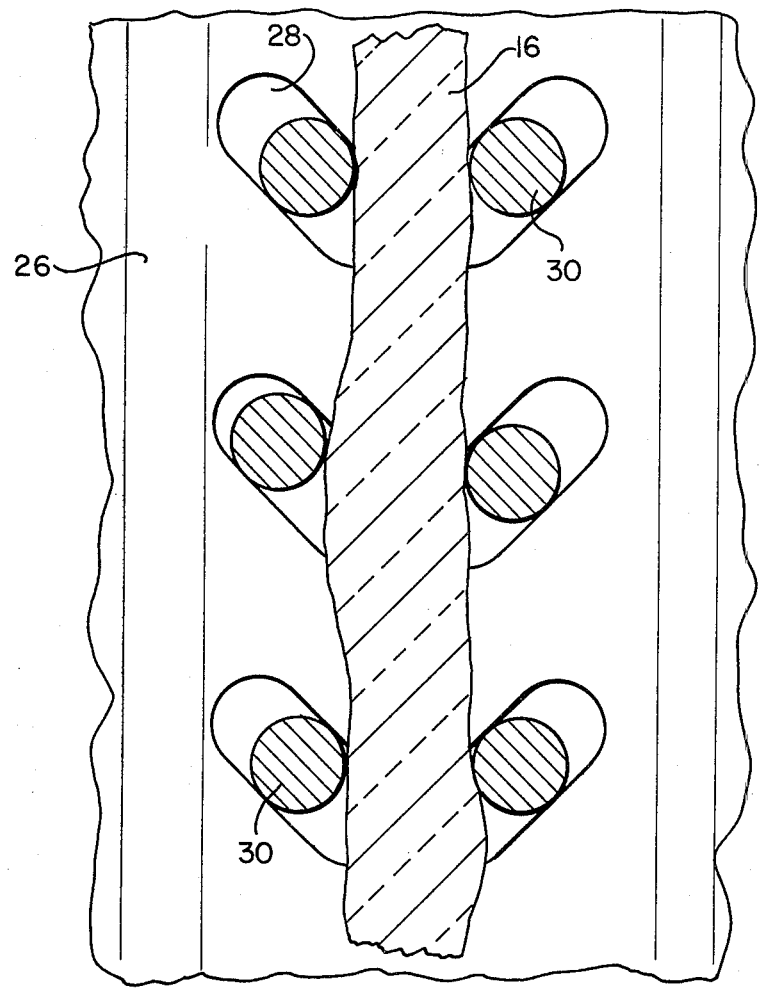
FIG. 4 is a view similar to FIG. 1 on a greatly enlarged scale, and showing certain details of the crystal growing guidance mechanism.

Referring to FIGS. 1-4, the crystal growing guidance mechanism 20 comprises a support member in the form of a vertically elongate hollow cylinder 26 formed of graphite or other refractory material such as molybdenum or high purity quartz. Cylinder 26 surrounds the growing crystal 16 for a distance verically above the radiation shields 14. Preferably, but not necessarily, cylinder 26 is located immediately above radiation shields 14. Cylinder 26 maybe fixed directly to the radiation shields 14 by suitable means (not shown). Alternatively, cylinder 26 maybe fixed by some other means (not shown) to the pulling mechanism. As seen in FIGS. 1 and 4, a plurality of ramped supports in the form of inclined elongated slots 28 are formed in the side wall of hollow cylinder 26. Slots 28 are arranged in four vertical columns disposed so that two vertically extending runs are formed at diametrically opposite sides of hollow cylinder 26, each run being defined by a pair of columns with the slots of each pair of columns being oppositely inclined from the vertical run and spaced from one another so that the lower ends of the slots in confronting vertical columns are spaced from one another slightly less than the thickness of the crystal ribbon 16 to be grown.

Figure 2:
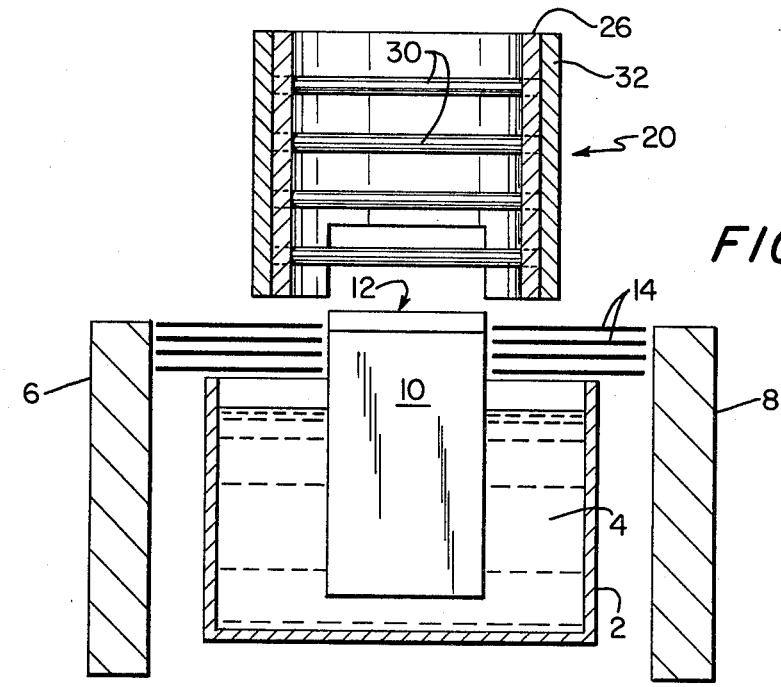
FIG. 2 is a side elevational view, in section, taken at a right angle to FIG. 1, with details of the belt puller omitted.

Supported between pairs of slots 28 on opposite sides of hollow cylinder 26 are cylindrical guide rods 30. Rods 30 are also formed of grahite or other refractory material such as molybdenum or high purity quartz. As seen particularly in FIG. 4, guide rods 30 have an o.d. which is just slightly smaller than the short axis dimension of the slots 28 openings. Thus guide rods 30 are freely moveable within the slots 28. As seen in FIGS. 2 and 3 guide rods 30 have a length that is just slightly less than the distance between the cylinder 26 outer walls as measured at slots 28. Completing the crystal growing guidance mechanism is a cylindrical graphite insulator sleeve 32 which is press fitted snugly around cylindrical member 26. Graphite insulator sleeve 32 provides the dual functions of (1) thermally insulating the growing crystal 16 and (2) preventing guidance rods 30 from the slipping out of slots 28. As seen in FIG. 1 member 26 and graphite insulator sleeve 32 are notched adjacent their lower ends, i.e. at 34 and 36, respectively, to provide windows for enabling visual observation of the growing crystal.

Figure 5:
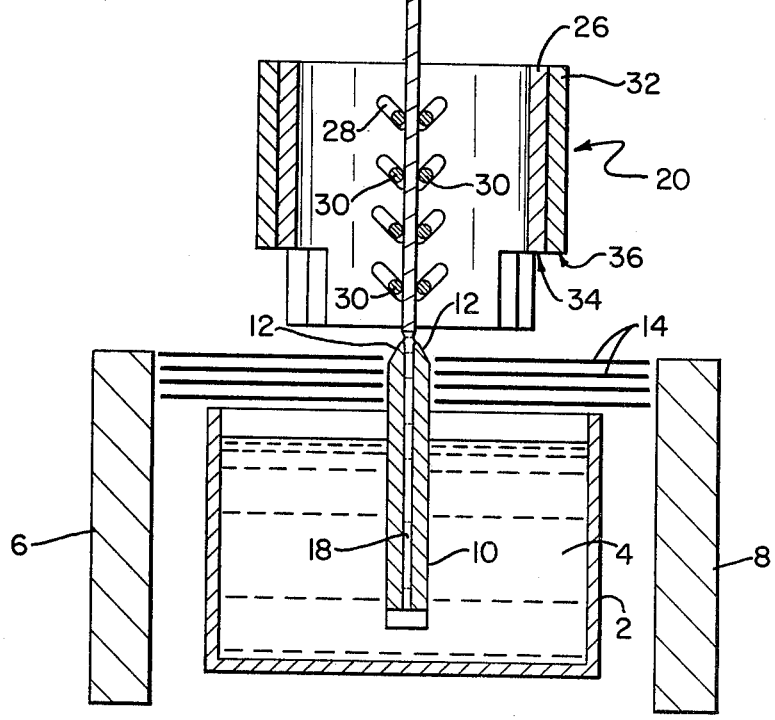
FIG. 5 is a side elevational view, partially cut away, showing a modification to the guidance mechanism of FIG. 1.

As mentioned previously, a feature and advantage of the present invention is the ability of individual guide rods 30 to move out of the way of any localized bulge, twist, ripple, surface particle or other like perturbation in the growing ribbon and thereby permit the growing ribbon to pass through the guidance mechanism 20, while all the guide rods 30, when acting in unison on the growing cystal 16, provide sufficient resistance to prevent puller induced motion from being felt at the die top. Accordingly, each guide rod 30 must have a freedom of movement and mass such that each guide rod 30 will "float" on the surface of the growing crystal 16 whereby each rod will be pushed upwardly in its respective supporting slots 28 out of the way of localized ribbon perturbations without deflecting the ribbon. On the other hand, guide rods 30 have sufficient mass, number and freedom of moment so that the guide rods acting in unison on the growing ribbon apply sufficient resistance or force on the growing ribbon to resist any general shift in the axis of the growing ribbon. One skilled in the art will recognize there are a number of factors at work which may be varied to achieve the foregoing. For one, the resistance of individual rods 30 can be varied by selection of material the rods are formed of, by varying the size (i.e. diameter) of the rods, and by making the rods hollow. Total resistance of the rods acting in unison is of course dependent on the total number of rods 30. Also, since the rods 30 are gravity damped, changing the angle of inclining of slots 28 will change the resistance exerted by rods 30. For convenience, slots 28 have been shown as having an angle 45° from the vertical; however, one skilled in the art would recognize that increasing the angle, e.g. to 60° to 70° would increase the downward moment of force each rod will exert on the growing crystal and this will increase the resistance to shifting offered by the rods. Further, the inclination of the slots 28 may be varied from the bottom to the top of cylinder 26 so as to vary the resistance to shifting as the growing ribbon passes between the rods 30. For example, as shown in FIG. 5, the angle of inclination of slots 28 increases from the bottom of cylinder to the top so that the amount of resistance is greater at the top than at the bottom. Another way to modify the resistance of rods 30 is to increase the spacing of rods per vertical inch.

It should be apparent to one skilled in the art that the crystal growing guidance mechanism in accordance with the present invention employing gravity damped, individually moveable rods has many advantages over fixed position guidance rods of the prior art. Moreover, the crystal growing guidance mechanism in accordance with the present invention may be used in crystal growth furnaces where the die is carried by a cartridge unit and also in crystal growing furnaces where the die is separately mounted to a crucible without any cartridge unit. Typically, where a cartridge unit is employed the crystal growing guidance mechanism may be mounted between the belt puller and the upper end of the cartridge unit and, if desired, the crystal growing guidance mechanism may function as a support for the cartridge unit. Alternatively, the cartridge unit may be attached to the belt puller by some other means with the crystal growing guidance mechanism disposed in between the cartridge unit and the belt puller. Where no cartridge unit is employed, the crystal growing guidance mechanism may be disposed directly above the die. It has been found that better control generally can be achieved by locating the crystal growing guidance mechanism reasonably close to the die, i.e. so that the lowermost pair of guidance rods 30 are within about 0.200 inches from the die upper end surface. However, good control in product quality also can be achieved by locating the crystal growing guidance mechanism between the cartridge and the belt puller. In the latter case satisfactory product is possible since the product is still somewhat flexible as it leaves the upper end of the cartridge.

Various changes may be made in the foregoing apparatus as will be obvious to one skilled in the art without departing from the spirit and scope of the invention. For example, the crystal growth guidance mechanism of the present invention may be advantageously used with other techniques for growing crystals from the melt, such as by the well-known Stepenov Technique, and with the crystal growth technique described in U.S. Pat. No. 4,000,030 issued Dec. 28, 1976 to Theodore F. Ciszek. Still other changes will be obvious to one skilled in the art.

What is claimed is:

1. In combination with apparatus for growing a continuous substantially flat crystal from a melt material, said apparatus including means for establishing a pool of said melt material and crystal pulling means vertically supported above said means for establishing said pool for pulling said crystal from said pool, a crystal growth guidance mechanism located between said means for establishing said pool and said crystal pulling means, said crystal growth guidance mechanism comprising a first plurality of guide rods, each respectively mounted on a corresponding one of a like plurality of pairs of spaced-apart ramped supports, said guide rods of said first plurality being spaced vertically apart with respect to one another, a second like plurality of guide rods, each respectively mounted on a corresponding one of a second like plurality of pairs of spaced-apart ramped supports, said guide rods of said second plurality being spaced vertically apart with respect to one another and disposed with respect to said first plurality of guide rods such that each guide rod of said first plurality opposes and is spaced from a corresponding guide rod of said second plurality by a predetermined spacing, the predetermined spacings between said first and second plurality of guide rods being such so as to define therebetween a vertically extending passageway between said means for establishing said pool and said crystal pulling means for guiding said crystal as it is pulled from said pool, said passageway having a width slightly less than the thickness of the crystal to be grown, said first and second pluralities of guide rods each having sufficient mass and number so that (1) when acting in unison said rods will provide sufficient resistance to prevent induced motion from being translated down the crystal to the top of said pool as said crystal is pulled from said pool, and (2) each guide rod will be moved against the force of gravity relative to the corresponding pair of ramped supports supporting the rod by localized surface perturbations in said growing crystal.

2. The combination according to claim 1 including a hollow cylinder surrounding said vertically extending passageway, said hollow cylinder comprising a plurality of inclined slots for defining said ramped supports.

3. The combination according to claim 1, wherein said ramped supports of said first and second pluralities are arranged such that each plurality of pairs of ramped supports defines a vertically extending run, the ramped supports of one run being vertically inclined in an opposite manner to and spaced from the ramped supports of the other run so that said guide rods when located at the vertically lower most position on their respective ramp supports define said vertically extending passageway.

4. The combination according to claim 3 wherein said ramped supports are angled at approximately 45° from the vertically extending passageway.

5. The combination according to claim 3 wherein said ramped supports are inclined with respect to the vertically extending passageway at angles which vary from the bottom to the top of said vertically extending passageway.

6. The combination according to claim 1 wherein said crystal is crystalline ribbon.

7. The combination according to claim 6 wherein said ribbon is silicon ribbon.

8. In combination with apparatus for growing a continuous substantially-flat crystalline body from a pool of melt material, said apparatus including means for providing a pool of melt material; crystal pulling means vertically supported above said means for providing said pool of melt; a guidance mechanism located between said pulling means and said means for providing said pool for guiding said crystalline body as said body is pulled from said pool of melt, said guidance mechanism comprising:

support means including a plurality of ramped support means;

a like plurality of guide rods each respectively mounted on a corresponding one of the ramp support means and movable with respect to said ramp support means from a vertically lower most position to a vertically higher position, said support means and said guide rods being disposed such that when said guide rods are all disposed in their corresponding vertically lowermost positions said guide rods provide two vertically extending runs of equal numbers of guide rods spaced from one another so as to define a vertically extending passageway between said two runs through which said body is pulled by said pulling means, said passageway having a space between said runs slightly less than the thickness of said body so that said guide rods collectively provide sufficient resistance to movement of said body so as to prevent puller induced motion from being transmitted from said pulling means to said pool, and each of said guide rods is movable towards its higher position away from said passageway by localized surface perturbations in said growing crystal.

9. The combination according to claim 8, wherein each said support means includes a pair of ramp supports, said ramp supports being arranged such that one ramp support of each pair defines a vertically extending run and the other ramp support of each pair defines another vertically extending run, the ramped supports of one run being vertically inclined in an opposite manner to and spaced from the supports of the other run so that said guide rods when located at the vertically lower most position on their respective ramp supports define said vertically extending passageway.

10. The combination according to claim 8 wherein said support means includes a hollow cylinder surrounding said vertically extending passageway, and said ramped support means comprises a pair of inclined slots formed in said hollow cylinder for supporting each of said guide rods.

11. The combination according to claim 10 wherein said pair of inclined slots are each angled at approximately 45° from the vertical.

12. The combination according to claim 10, further including a sleeve disposed around said cylinder for maintaining said guide rods in said slots.

13. The combination according to claim 12, wherein said cylinder is made of graphite, and said sleeve is made of a thermally insulative material.

14. The combination according to claim 8 wherein said rods provide resistances to the movement of said crystalline body which vary from the bottom to the top of said passageway.

15. The combination according to claim 8 wherein said body is a crystalline ribbon.

16. The combination according to claim 15 wherein said material is silicon.

* * * * *

UNITED STATES PATENT AND TRADEMARK OFFICE
CERTIFICATE OF CORRECTION

PATENT NO. : 4267153
DATED : May 12, 1981
INVENTOR(S) : Aaron Spencer Taylor

It is certified that error appears in the above-identified patent and that said Letters Patent are hereby corrected as shown below:

Claim 1, column 6, line 41, the word "puller" should be inserted after the word "prevent".

Claim 9, column 8, line 10, the word "ramped" should be inserted after the word "the" first occurrence.

*Signed and Sealed this*

*Twenty-eighth* Day of *July 1981*

[SEAL]

*Attest:*

*Attesting Officer*

GERALD J. MOSSINGHOFF

*Commissioner of Patents and Trademarks*